(12) United States Patent
Kotani et al.

(10) Patent No.: US 7,337,426 B2
(45) Date of Patent: Feb. 26, 2008

(54) PATTERN CORRECTING METHOD, MASK MAKING METHOD, METHOD OF MANUFACTURING SEMICONDUCTOR DEVICE, PATTERN CORRECTION SYSTEM, AND COMPUTER-READABLE RECORDING MEDIUM HAVING PATTERN CORRECTION PROGRAM RECORDED THEREIN

(75) Inventors: Toshiya Kotani, Machida (JP); Shigeki Nojima, Yokohama (JP); Kazuhito Kobayashi, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 11/115,187

(22) Filed: Apr. 27, 2005

(65) Prior Publication Data

US 2005/0257188 A1  Nov. 17, 2005

(30) Foreign Application Priority Data

Apr. 28, 2004  (JP) ............................. 2004-134010

(51) Int. Cl.
*G06F 17/50* (2006.01)
(52) U.S. Cl. ............................................ 716/21; 716/5
(58) Field of Classification Search .................. 716/19, 716/21, 5; 430/5
See application file for complete search history.

(56) References Cited

U.S. PATENT DOCUMENTS 5,879,844 A    3/1999  Yamamoto et al.
6,298,473 B1   10/2001  Ono et al.
6,303,251 B1   10/2001  Mukai et al.
6,567,972 B1 *  5/2003  Tanaka et al. .............. 716/21
6,658,641 B2 * 12/2003  Ashida et al. .............. 716/21
6,883,158 B1 *  4/2005  Sandstrom et al. ......... 716/19
7,065,739 B2 *  6/2006  Kobayashi et al. ......... 716/21
7,069,533 B2 *  6/2006  Kochpatcharin et al. ... 716/19
2003/0033581 A1 *  2/2003  Mukai ........................ 716/2
2003/0192015 A1 * 10/2003  Liu ............................ 716/4

FOREIGN PATENT DOCUMENTS

| JP | 09-319067 A2 | 12/1997 |
| JP | 10010700 A * | 1/1998 |
| JP | 11-102062 A2 | 4/1999 |
| JP | 2003-017390 A2 | 1/2003 |

\* cited by examiner

*Primary Examiner*—Thuan Do
*Assistant Examiner*—Magid Y. Dimyan
(74) *Attorney, Agent, or Firm*—Finnegan, Henderson, Farabow, Garrett & Dunner, L.L.P.

(57) ABSTRACT

There is disclosed a pattern correcting method comprising extracting a correction pattern, at least the one or more correction patterns being included in a first design pattern formed on a substrate, acquiring layout information from the first design pattern, the layout information affecting a finished plane shape of the correction pattern on the substrate, determining contents of correction onto the correction pattern on the basis of the layout information, generating a design pattern-2 corresponding to the layout information so as to be associated with the correction pattern, and correcting the correction pattern in accordance with the contents of correction corresponding to the design pattern-2.

20 Claims, 5 Drawing Sheets

| Pattern width (W) | Adjacent space width (S) | Mark pattern (( ) is layer name) |
|---|---|---|
| $w1 \leq w < w2$ | $s3 \leq s < s2$ | No |
| $w1 \leq w < w2$ | $s2 \leq s < s1$ | Yes (m2) |
| $w1 \leq w < w2$ | $s1 \leq s$ | Yes (m1) |
| $w2 \leq w$ | $s3 \leq s < s2$ | Yes (m4) |
| $w2 \leq w$ | $s2 \leq s < s1$ | Yes (m3) |
| $w2 \leq w$ | $s1 \leq s$ | Yes (m5) |

F I G. 3

| Pattern width (W) | Adjacent space width (S) | Mark pattern (( ) is layer name) | Edge correction amount (Edge movement amount) (nm/edge) |
|---|---|---|---|
| $w1 \leq w < w2$ | $s3 \leq s < s2$ | No | 0 |
| $w1 \leq w < w2$ | $s2 \leq s < s1$ | Yes (m2) | −5 |
| $w1 \leq w < w2$ | $s1 \leq s$ | Yes (m1) | +15 |
| $w2 \leq w$ | $s3 \leq s < s2$ | Yes (m4) | +20 |
| $w2 \leq w$ | $s2 \leq s < s1$ | Yes (m3) | −10 |
| $w2 \leq w$ | $s1 \leq s$ | Yes (m5) | +10 |

| Pattern covering rate (C) | Mark pattern (( ) is layer name) |
|---|---|
| $c1 \leqq c < c2$ | Yes (m3) |
| $c2 \leqq c < c3$ | Yes (m2) |
| $c3 \leqq c < c4$ | Yes (m1) |
| $c4 \leqq c < c5$ | Yes (m4) |

FIG. 8

PATTERN CORRECTING METHOD, MASK MAKING METHOD, METHOD OF MANUFACTURING SEMICONDUCTOR DEVICE, PATTERN CORRECTION SYSTEM, AND COMPUTER-READABLE RECORDING MEDIUM HAVING PATTERN CORRECTION PROGRAM RECORDED THEREIN

CROSS-REFERENCE TO RELATED APPLICATIONS

This application is based upon and claims the benefit of priority from prior Japanese Patent Application No. 2004-134010, filed Apr. 28, 2004, the entire contents of which are incorporated herein by reference.

BACKGROUND OF THE INVENTION

1. Field of the Invention

The present invention relates to a pattern formation technology in a process of manufacturing a semiconductor device, and in particular, to a pattern correcting method, a mask making method, a method of manufacturing a semiconductor device, a pattern correction system, and a computer-readable recording medium having a patter correction program recorded therein, which are capable of improving precision in forming fine patterns.

2. Description of the Related Art

In recent years, as the miniaturization of patterns formed on a semiconductor wafer has progressed, the problem that a final finished dimension of a pattern actually formed is not the same as a dimension of a desired design pattern has been brought about. In order to solve such a problem, some technologies in which, for example, a mask pattern different from a design pattern is made have been proposed. Those technologies are disclosed in, for example, Jpn. Pat. Appln. KOKAI Publication Nos. 9-319067, 11-102062, and 2003-17390, and the like. Hereinafter, such technologies are called mask data processings. The mask data processings include, for example, mask data processing called process proximity correction (PPC) processing. The PPC processing is carried out in order to correct an error (processing conversion difference) called a process proximity effect (PPE) which occurs in each of various processes such as a lithography process and an etching process.

It has been known that a processing conversion difference occurring in each process described above is varied by another pattern disposed in the vicinity of a correction object pattern, which is about several µm from the correction object pattern. Further, it has been known that, a processing conversion difference occurring in, in particular, an etching process or a mask process is varied by, not only a pattern disposed in the vicinity of the correction object pattern, but also another pattern disposed at a position which is relatively distant from the correction object pattern, namely, which is about several ten µm to several mm from the correction object pattern. Such technology for avoiding a processing conversion difference by a long-distant pattern is disclosed in, for example, Jpn. Pat. Appln. KOKAI Publication No. 2003-17390. This technology is that a dummy pattern is inserted into a pattern forming region, and the variations of the layouts of other patterns at a long distance from the correction object patterns are reduced, and whereby an effect on a processing conversion difference from the long-distant pattern with respect to the correction object pattern is reduced.

As described above, Jpn. Pat. Appln. KOKAI Publication No. 2003-17390 discloses the technology in which an effect on a processing conversion difference from a long-distant pattern is reduced by inserting a dummy pattern into a pattern forming region. However, there are cases in which a dummy pattern cannot be disposed depending on a device structure. In this case, in accordance with the technology in Jpn. Pat. Appln. KOKAI Publication No. 2003-17390 described above, an effect on a processing conversion difference from a long distance cannot be reduced. Accordingly, another technique for correcting an effect from a long-distant pattern onto the correction object pattern is required.

However, in a case of correcting a pattern in consideration of an effect from a long-distant pattern onto the correction object pattern, the following two problems are brought about. One is the problem that a time until a correction value (correction amount) with respect to the correction object pattern is determined is easily increased. The reason for this is as follows. In the case of correcting a pattern in consideration of an effect from a long-distant pattern onto the correction object pattern, it is necessary to estimate effects from long-distant patterns onto respective correction object patterns for each correction object pattern, and to determine correction values in accordance with each effect. Therefore, a time until a correction value (correction amount) with respect to the correction object pattern is determined is increased as a distance from the correction object pattern to the long-distant pattern increases. The other one is the problem that a processing time required for correction and a data amount which must be considered are easily increased considerably. The reason for this is as follows. For example, when design data of a pattern to be formed has a hierarchical structure, the farther the distance from a correction object pattern to another pattern for being referred at the time of correction is, the more the data are expanded. Consequently, a processing time required for correction and a data amount which must be considered are increased considerably.

The problems bring about increases in a PPC processing time, a PPC verification time, a mask drawing time, and the like, and greatly affect a turn around time (TAT) in making of a device. As a result, there is a great concern that a reduction in the production efficiency and a steep rise in the production cost of the semiconductor device are brought about.

BRIEF SUMMARY OF THE INVENTION

According to an aspect of the invention, there is provided a pattern correcting method comprising: extracting a correction pattern, at least the one or more correction patterns being included in a first design pattern formed on a substrate; acquiring layout information from the first design pattern, the layout information affecting a finished plane shape of the correction pattern on the substrate; determining contents of correction onto the correction pattern on the basis of the layout information; generating a design pattern-2 corresponding to the layout information so as to be associated with the correction pattern; and correcting the correction pattern in accordance with the contents of correction corresponding to the design pattern-2.

According to another aspect of the invention, there is provided a mask making method comprising: forming a plurality of mask patterns by using a first design pattern including a correction pattern onto which correction has been applied by a pattern correcting method, the pattern correcting method comprising: extracting the correction patterns, at least the one or more correction patterns being included in the first design pattern formed on a substrate; acquiring layout information from the first design pattern, the layout information affecting a finished plane shape of the correction pattern on the substrate; determining contents of correction onto the correction pattern on the basis of the layout information; generating a design pattern-2 corresponding to the layout information so as to be associated with the correction pattern; and correcting the correction pattern in accordance with the contents of correction corresponding to the design pattern-2.

According to another aspect of the invention, there is provided a method of manufacturing a semiconductor device, comprising: forming a plurality of mask patterns formed by a mask making method, on a semiconductor substrate, the mask making method comprising forming the each mask pattern by using a first design pattern including a correction pattern onto which correction has been applied by a pattern correcting method, the pattern correcting method comprising: extracting the correction pattern, at least the one or more correction patterns being included in the first design pattern formed on the semiconductor substrate; acquiring layout information from the first design pattern, the layout information affecting a finished plane shape of the correction pattern on the semiconductor substrate; determining contents of correction onto the correction pattern on the basis of the layout information; generating a design pattern-2 corresponding to the layout information so as to be associated with the correction pattern; and correcting the correction pattern in accordance with the contents of correction corresponding to the design pattern-2.

According to yet another aspect of the invention, there is provided a pattern correction system comprising: a pattern generating apparatus; and a data processing apparatus, wherein generation rules of a design pattern-2 are inputted to the pattern generating apparatus, the design pattern-2 executes contents of correction onto a correction pattern with respect to the correction pattern, at least the one or more correction patterns are included in a first design pattern formed on a substrate, and the contents of correction are determined on the basis of layout information which affects a finished plane shape of the correction pattern on the substrate, the pattern generating apparatus generates the design pattern-2 on the basis of the generation rules, and so as to be associated with the correction pattern extracted from the first design pattern, the first design pattern including the correction pattern and the design pattern-2 are inputted to the data processing apparatus from the pattern generating apparatus, and the data processing apparatus corrects the correction pattern in accordance with the contents of correction corresponding to the design pattern-2.

According to still another aspect of the invention, there is provided a computer-readable recording medium having a pattern correction program recorded therein, the pattern correction program causing a computer to execute: a correction pattern extraction process of extracting at least one or more correction patterns included in a first design pattern formed on a substrate; a layout information acquisition process of acquiring layout information which affects a finished plane shape of the correction pattern on a semiconductor substrate from the first design pattern; a correction contents determination process of determining contents of correction onto the correction pattern on the basis of the layout information; a design pattern-2 generation process of generating a design pattern-2 corresponding to the layout information so as to be associated with the correction pattern; and a correction process of correcting the correction pattern in accordance with the contents of correction corresponding to the design pattern-2.

DETAILED DESCRIPTION OF THE INVENTION

Hereinafter, respective embodiments according to the invention will be described with reference to the drawings.

FIRST EMBODIMENT

Figure 1:
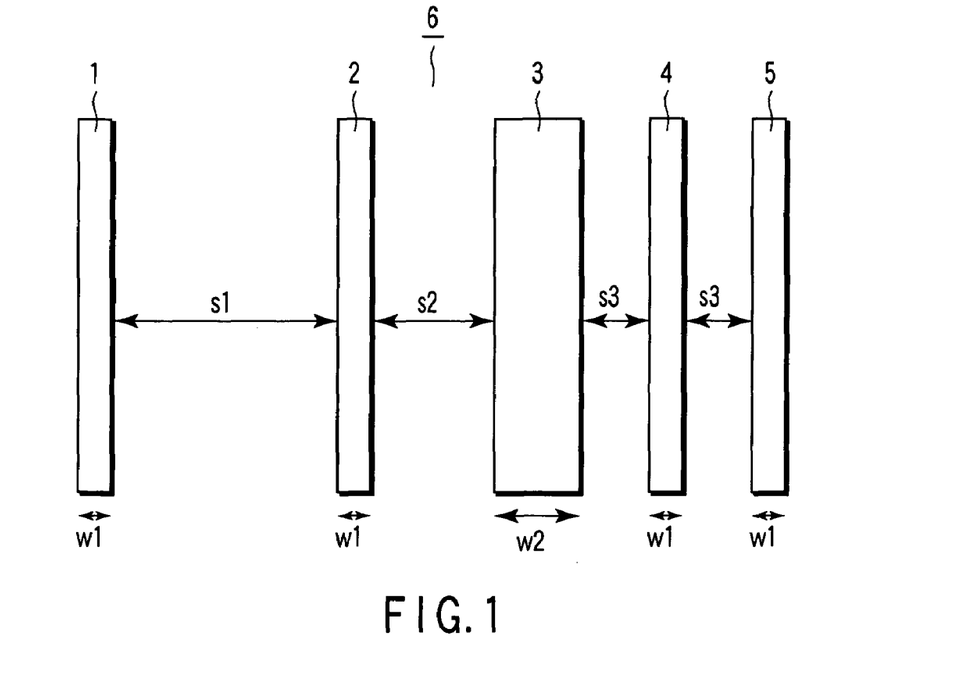
FIG. 1 is a plan view showing a plurality of patterns to be formed on a substrate according to a first embodiment of the invention.
Figure 2:
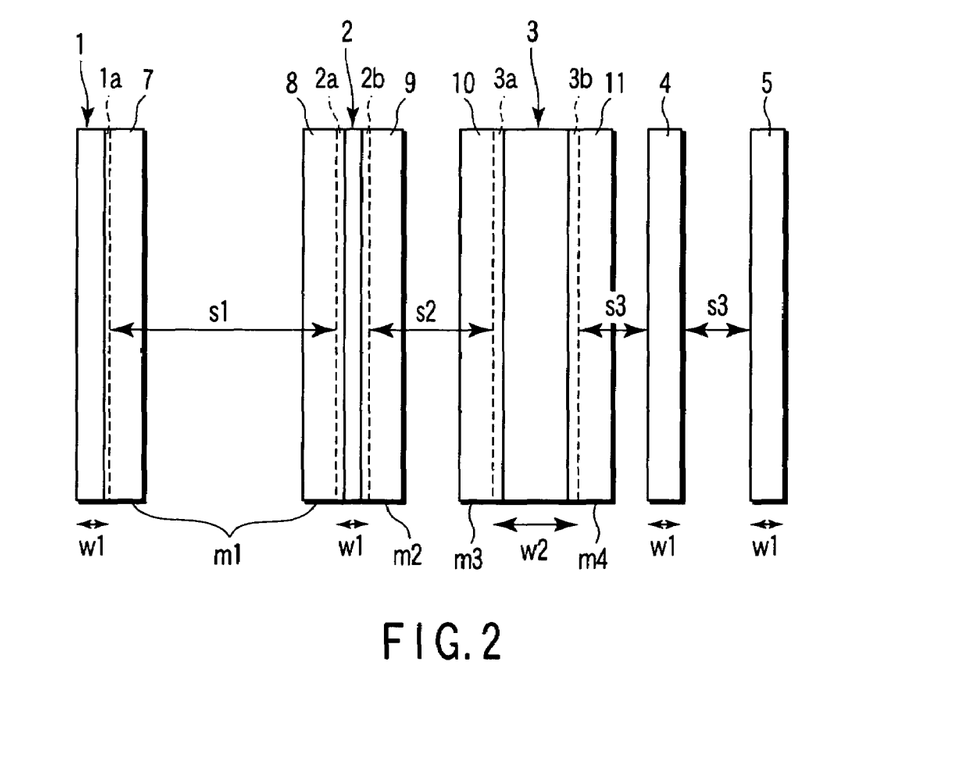
FIG. 2 is a plan view showing the respective patterns of FIG. 1 to which patterns for correction have been added.
Figure 3:
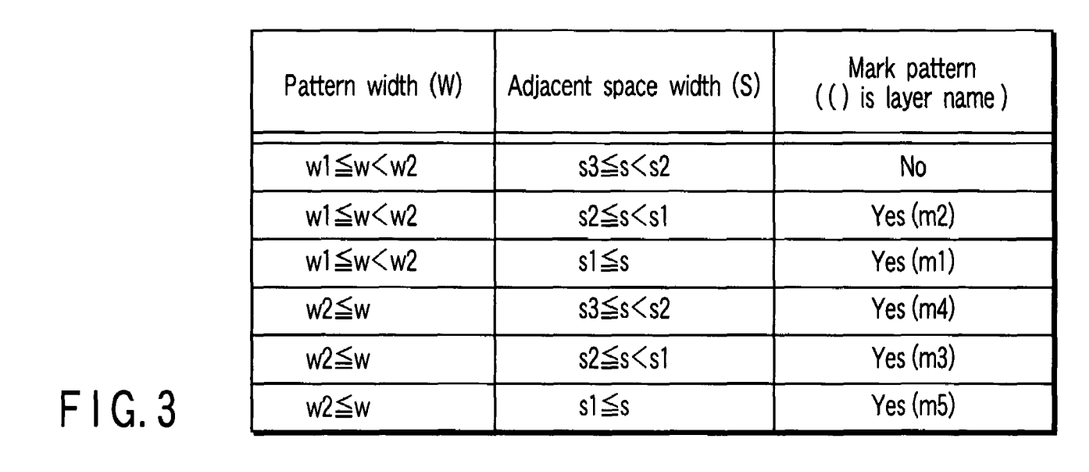
FIG. 3 is a table showing generation rules of the patterns for correction of FIG. 2.
Figure 4:
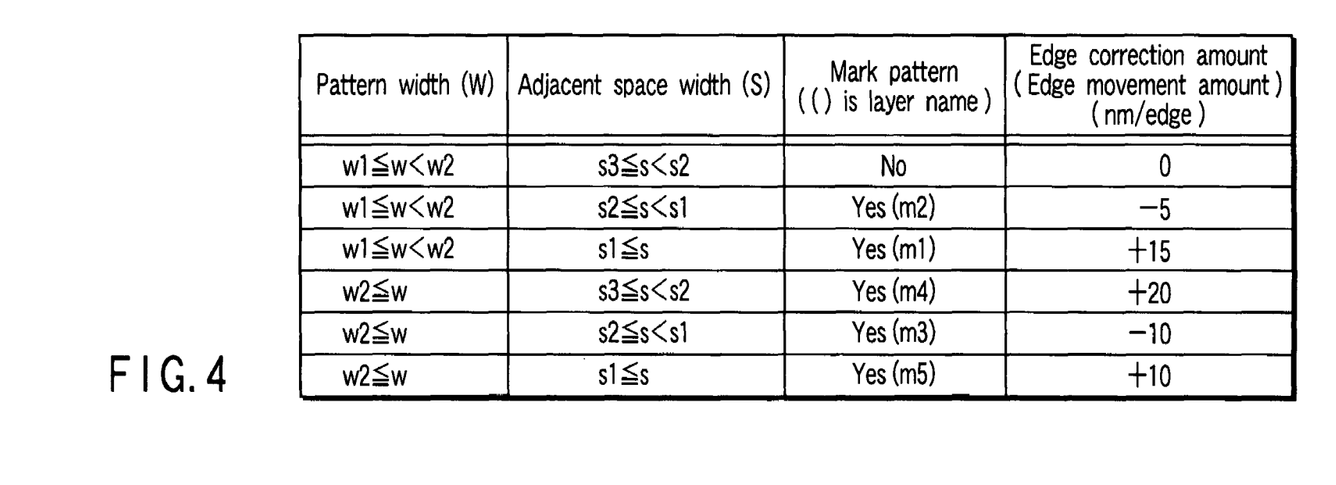
FIG. 4 is a table showing relationships between the patterns for correction of FIG. 2 and correction amounts.
Figure 5:
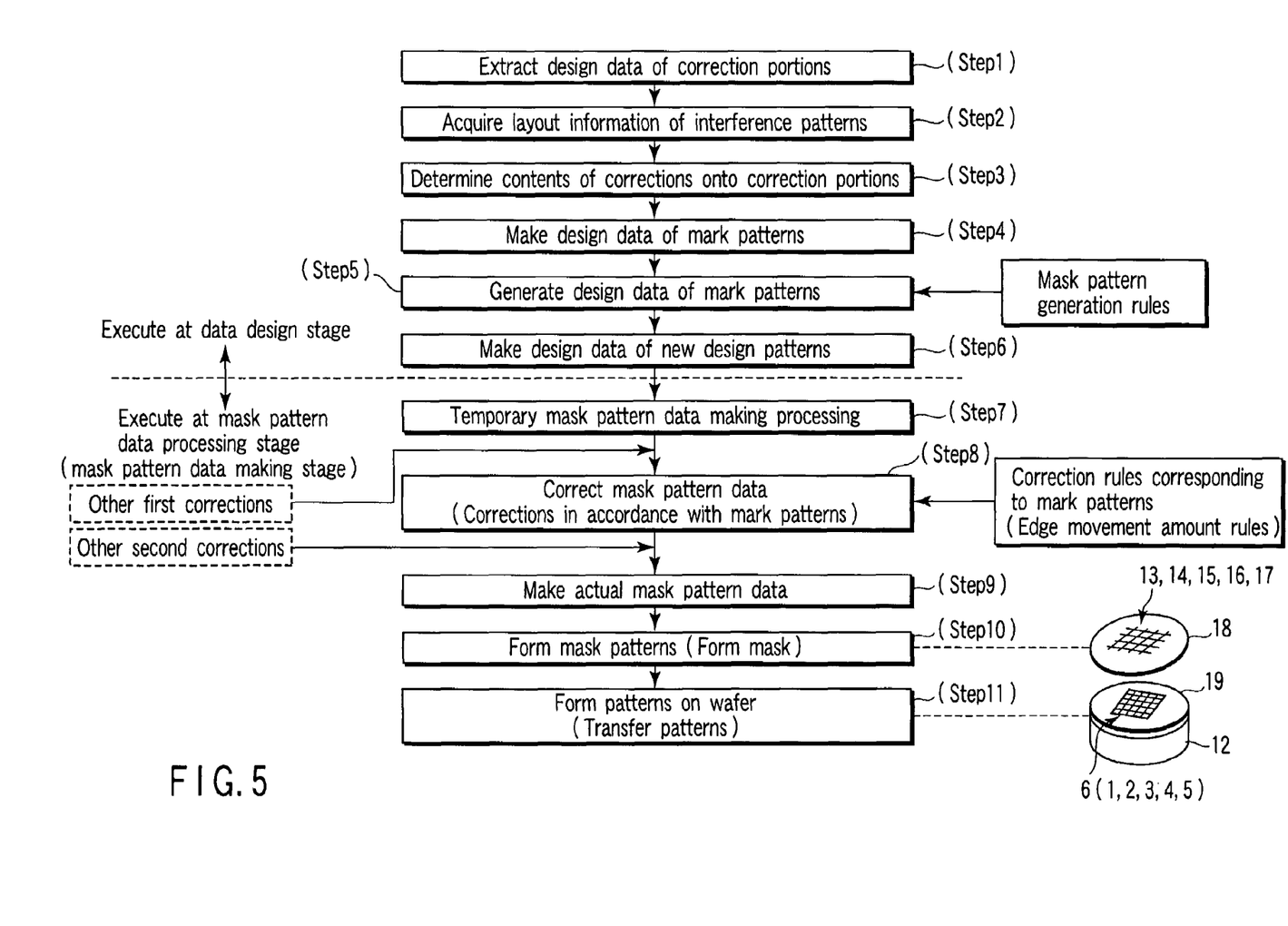
FIG. 5 is a flow chart showing a pattern correcting method, a mask making method, and a method of manufacturing a semiconductor device according to the first embodiment of the invention.
Figure 6:
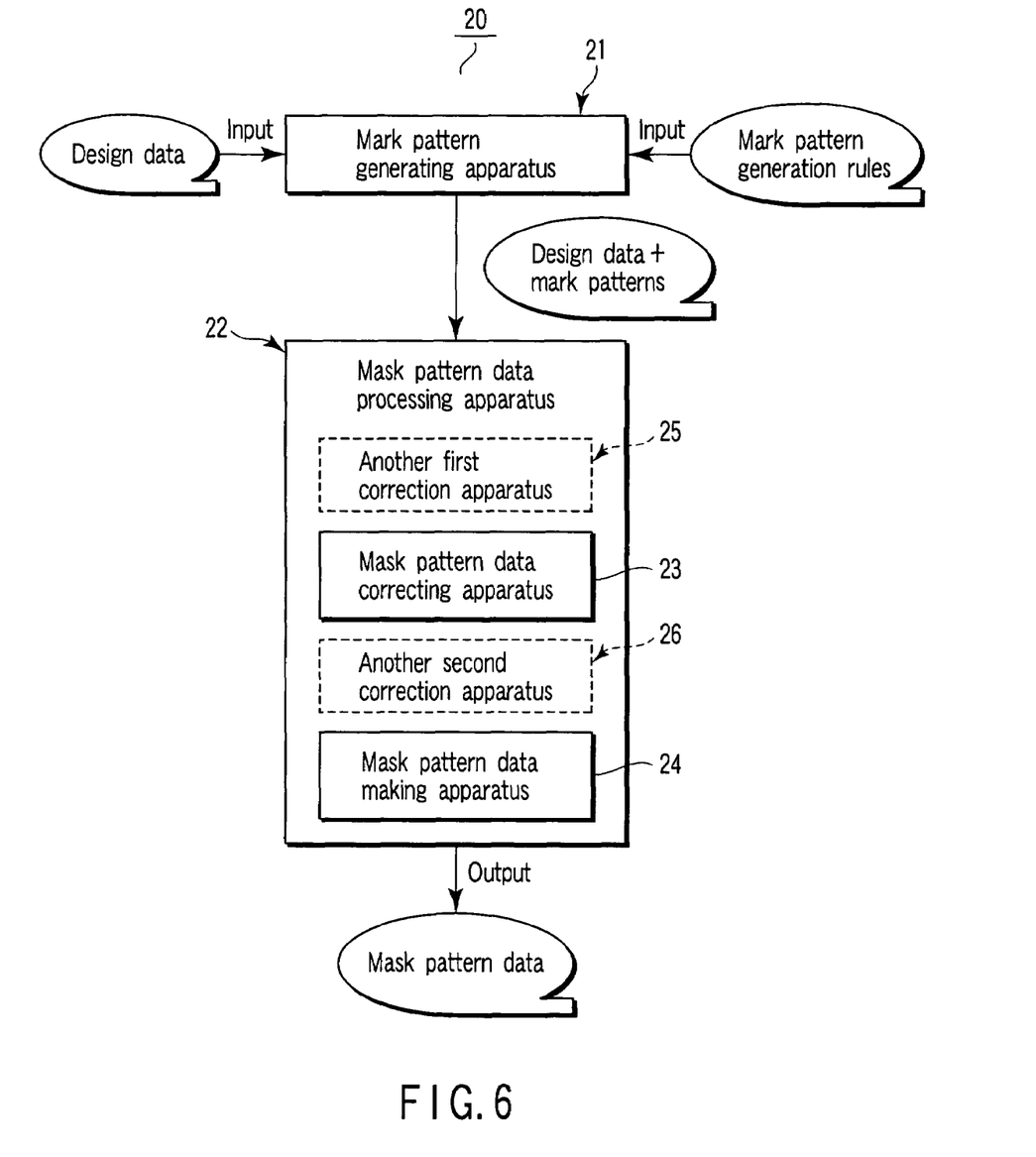
FIG. 6 is a simplified block diagram showing a pattern correction system according to the first embodiment.
Figure 7:
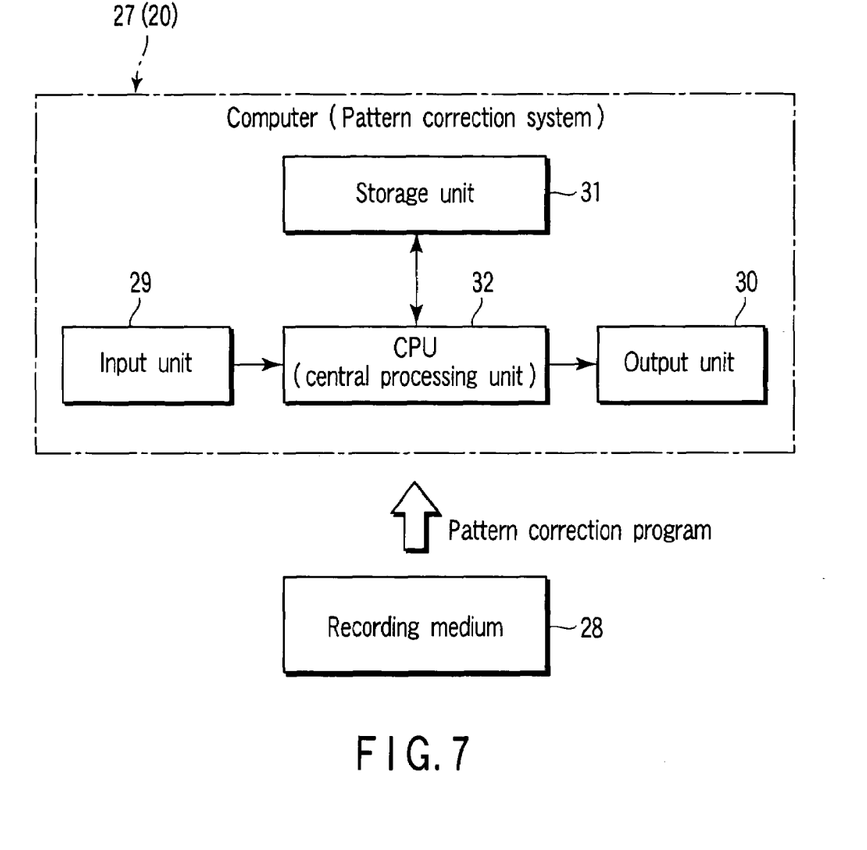
FIG. 7 is a simplified block diagram showing a relationship between a pattern correction program and a computer-readable recording medium having the pattern correction program recorded therein according to the first embodiment, and the pattern correction system of FIG. 6.

First, a first embodiment according to the invention will be described with reference to FIGS. 1 to 7. FIG. 1 is a plan view showing a plurality of patterns to be formed on a substrate according to the first embodiment. FIG. 2 is a plan view showing the respective patterns of FIG. 1 to which patterns for correction are added. FIG. 3 is a table showing generation rules of the patterns for correction of FIG. 2. FIG. 4 is a table showing relationships between the patterns for correction of FIG. 2 and correction amounts. FIG. 5 is a flow chart showing a pattern correcting method, a mask making method, and a method of manufacturing a semiconductor device according to the embodiment. FIG. 6 is a simplified block diagram showing a pattern correction system according to the embodiment. FIG. 7 is a simplified block diagram showing a relationship between a pattern correction program and a computer-readable recording medium having the pattern correction program recorded therein according to the embodiment, and the pattern correction system of FIG. 6.

In the present embodiment, a technology will be described in which correction portions of correction object patterns are corrected on the basis of layout information of other patterns which are relatively distant from the correction object patterns, namely, which are several ten μm to several mm from the correction object patterns. As the layout information of other patterns which are relatively distant from the correction object patterns, for example, pattern covering rates, distances among adjacent patterns, and the like are used. On the basis of the layout information of the long-distant patterns, design data of mark patterns which are patterns for corrections onto correction potions are disposed in the vicinity of design data of the correction object patterns. The contents of corrections corresponding to the correction portions of the correction object patterns are described in the design data of the mark patterns. For example, edge portions of the correction object patterns are corrected in accordance with the contents of corrections included in the design pattern of the mark patterns. According to this technology, merely if the contents of the data of the mark patterns in the vicinity of the correction object patterns are determined, highly-precise corrections based on the layout information of the patterns which are relatively distant from the correction object patterns can be executed at a high speed without increasing the data amounts thereof. Hereinafter, this will be described in detail.

First, a pattern correcting method according to the embodiment will be described with reference to FIGS. 1 to 5. Note that the following descriptions are subjects from the standpoint of data unless there is a notice in particular.

As shown in FIG. 1, respective design data of a plurality of patterns (design patters, first design patterns) 1, 2, 3, 4, 5 to be formed on a substrate (not shown) are disposed so as to form a pattern group 6 set in advance at a design stage. Among these respective design patterns 1, 2, 3, 4, 5, the design patterns 1, 2, 3 are the first patterns in which portions to be corrected are respectively included in at least one parts. In the following descriptions, these respective first patterns 1, 2, 3 will be called correction object patterns (correction patterns) 1, 2, 3.

The pattern widths of the respective design patterns 1, 2, 3, 4, 5 are respectively set to sizes of w1 or w2 (>w1). In addition thereto, intervals (distances) among the respective design patterns 1, 2, 3, 4, 5, i.e., adjacent space width (s) are respectively set to one of the sizes of s1, s2, s3 (s1>s2>s3). In the embodiment, the design patterns 4, 5 among the design patterns 1, 2, 3, 4, 5 are second patterns which affect the shapes, the dimensions, the precision, and the like of the respective correction object patterns 1, 2, 3. In the following descriptions, the second patterns 4, 5 will be called interference patterns 4, 5. The interference patterns 4, 5 bring about errors in the shapes, the dimensions, the precision, and the like of the respective correction object patterns 1, 2, 3 by interfering with the correction object patterns 1, 2, 3. Namely, the interference patterns 4, 5 affect the finished plane shapes of the respective correction object patterns 1, 2, 3 on a semiconductor substrate (not shown). Note that, in the embodiment, the correction object patterns 1, 2, 3 are respectively interference patterns (second patterns) 1, 2, 3 which bring about errors therein by interfering with one another.

As shown in FIG. 2, in order to correct respective correction portions 1a, 2a, 2b, 3a, 3b of the correction object patterns 1, 2, 3, design data of a plurality of third patterns (design patterns-2) 7, 8, 9, 10, 11 are generated with respect to the design data of the correction object patterns 1, 2, 3. In the following descriptions, the respective third patterns 7, 8, 9, 10, 11 will be called mark patterns (patterns for corrections). The design data of the mark patterns 7, 8, 9, 10, 11 are disposed so as to be designed to execute appropriate contents of corrections corresponding to each of the respective correction portions 1a, 2a, 2b, 3a, 3b with respect to the design data of the respective correction portions 1a, 2a, 2b, 3a, 3b.

The contents of corrections onto the correction portions 1a, 2a, 2b, 3a, 3b are determined on the basis of the layout information of the interference patterns which are provided on the peripheries of the correction object patterns 1, 2, 3 and interfere with the respective correction object patterns 1, 2, 3, among the respective layout information of the respective design patterns 1, 2, 3, 4, 5. In the embodiment, the contents of corrections onto the correction portions 1a, 2a, 2b, 3a, 3b are made on the basis of the layout information of, broadly divided, two types of interference patterns. One is the layout information of the correction object patterns 1, 2, 3 which are the interference patterns which interfere with one another as well. Further, the other one is the layout information of the two interference patterns 4, 5 which are provided on the peripheries of the respective correction object patterns 1, 2, 3, and which interfere with the respective correction object patterns 1, 2, 3. Namely, the appropriate contents of corrections corresponding to each of the correction potions 1a, 2a, 2b, 3a, 3b of the correction object patterns 1, 2, 3 are described in the design data of the mark patterns 7, 8, 9, 10, 11, on the basis of the layout information of each of the interference patterns 1, 2, 3, 4, 5.

The design data of the respective mark patterns 7, 8, 9, 10, 11 are generated within a region where those are processed collectively along with the design data of the correction potions 1a, 2a, 2b, 3a, 3b. At that time, the design data of the mark patterns 7, 8, 9, 10, 11 are generated so as to be associated with the design data of the respective correction potions 1a, 2a, 2b, 3a, 3b. Further, the design data of the mark patterns 7, 8, 9, 10, 11 are generated in accordance with predetermined generation rules set in advance. As shown in FIG. 2, in the embodiment, the respective mark patterns 7, 8, 9, 10, 11 are disposed to cover so as to include the correction portions 1a, 2a, 2b, 3a, 3b of the respective correction object patterns 1, 2, 3 which are the correction objects thereof. Namely, the respective mark patterns 7, 8, 9, 10, 11 are disposed within a region where those are overlapped upon the edge portions 1a, 2a, 2b, 3a, 3b of the respective correction object patterns 1, 2, 3. The design data of the respective correction portions 1a, 2a, 2b, 3a, 3b of the respective correction object patterns 1, 2, 3 are corrected in accordance with the respective contents of corrections included in the design data of the respective mark patterns 7, 8, 9, 10, 11 generated in this way.

One example of the generation rules of mark patterns in the embodiment is shown in FIG. 3. In accordance with the generation rules shown in FIG. 3, the mark patterns 7, 8, 9, 10, 11 are generated so as to be layers different for each rule. One of the layer names m1, m2, m3, m4, m5 is provided to each of the generated mark patterns 7, 8, 9, 10, 11. As described above, the design data of the respective mark patterns 7, 8, 9, 10, 11 are made on the basis of the respective layout information of the interference patterns 1, 2, 3, 4, 5. In the embodiment, as the respective layout information of the interference patterns 1, 2, 3, 4, 5, the pattern widths w of the interference patterns 1, 2, 3, 4, 5, and the adjacent space widths s which are intervals among the interference patterns 1, 2, 3, 4, 5 which are adjacent to one another are used. Accordingly, the methods for generating the mark patterns 7, 8, 9, 10, 11 are made into rules such that the respective mark patterns 7, 8, 9, 10, 11 are generated as mark layers which are different each pattern width w and each adjacent space width s of the interference patterns 1, 2, 3, 4, 5. Namely, the generation rules are made (set) such that the mark patterns 7, 8, 9, 10, 11 are generated as mark layers by which appropriate corrections are executed onto the correction portions 1a, 2a, 2b, 3a, 3b of the correction object patterns 1, 2, 3, in accordance with each pattern width w and each adjacent space width s of the interference patterns 1, 2, 3, 4, 5.

Hereinafter, a mask forming method and a pattern forming method including a pattern correcting method according to the embodiment will be described in detail with reference to mainly the flowchart shown in FIG. 5.

First, as shown in FIG. 5, design data corresponding to the respective correction portions 1a, 2a, 2b, 3a, 3b are extracted from the correction object patterns 1, 2, 3 in which portions to be corrected are included in at least one parts thereof, among the respective design data of the plurality of design patterns 1, 2, 3, 4, 5 formed on a semiconductor substrate 12. As described above, the respective design data of the design patterns 1, 2, 3, 4, 5 are disposed so as to form the pattern group 6 set in advance at the design stage as shown in FIG. 1. This is regarded as Step 1.

Next, among the respective layout information of the design patterns 1, 2, 3, 4, 5, the respective layout information of the interference patterns 1, 2, 3, 4, 5 which are provided on the peripheries of the correction object patterns 1, 2, 3, and which interfere with the correction object patterns 1, 2, 3 are acquired. This is regarded as Step 2.

Next, the contents of corrections corresponding to the respective correction portions 1a, 2a, 2b, 3a, 3b of the correction object patterns 1, 2, 3 are determined. These contents of corrections are determined on the basis of the respective layout information of the interference patterns 1, 2, 3, 4, 5. This is regarded as Step 3.

Next, respective design data of the mark patterns 7, 8, 9, 10, 11 in which the determined contents of corrections are executed onto the respective correction portions 1a, 2a, 2b, 3a are made. The respective design data of the mark patterns 7, 8, 9, 10, 11 are made on the basis of the respective layout information of the interference patterns 1, 2, 3, 4, 5. This is regarded as Step 4.

Next, the respective design data of the mark patterns 7, 8, 9, 10, 11 are generated. The respective design data of the mark patterns 7, 8, 9, 10, 11 are generated on the basis of the generation rules of mark patterns which have been made in advance as described above. At that time, the respective design data of the mark patterns 7, 8, 9, 10, 11 are generated within a region where those are processed collectively along with the respective design data of the correction potions 1a, 2a, 2b, 3a, 3b of the correction object patterns 1, 2, 3. In addition thereto, the respective design data of the mark patterns 7, 8, 9, 10, 11 are generated so as to be associated with the respective design data of the correction potions 1a, 2a, 2b, 3a, 3b. In the embodiment, as described above, the respective design data of the mark patterns 7, 8, 9, 10, 11 are generated so as to be overlapped upon the design data of the edge portions 1a, 2a, 2b, 3a, 3b which are the respective correction portions of the correction object patterns 1, 2, 3 as shown in FIG. 2. In accordance with such a mark pattern generating method, the hierarchical structures of the respective design data of the design patterns 1, 2, 3, 4, 5, and the mark patterns 7, 8, 9, 10, 11 can be maintained. Accordingly, regardless of the generations of the respective mark patterns 7, 8, 9, 10, 11, the data amounts required for corrections onto the respective edge portions 1a, 2a, 2b, 3a, 3b of the correction object patterns 1, 2, 3 can be suppressed. As a result, an explosive increase in a data amount and a time required for corrections onto the respective edge portions 1a, 2a, 2b, 3a, 3b can be avoided. This is regarded as Step 5.

Note that Step 3, Step 4, and Step 5 may be set so as to be collectively processed in the same step.

Next, the design data of the respective design patterns 1, 2, 3, 4, 5 are made over again so as to include the design data of the respective mark patterns 7, 8, 9, 10, 11. Namely, as shown in FIG. 2, the respective design data of the respective new design patterns (respective interference patterns) 1, 2, 3, 4, 5 including the respective edge portions 1a, 2a, 2b, 3a, 3b of the respective correction object patterns 1, 2, 3 which have been associated with the respective mark patterns 7, 8, 9, 10, 11 in Step 5 are made. This is regarded as Step 6.

Step 1 to step 6 up to now are executed at a so-called data design stage at the side upper than the broken line shown in FIG. 5. As described above, in order to generate the respective design data of the respective design patterns 1, 2, 3, 4, 5 and the respective mark patterns 7, 8, 9, 10, 11 shown in FIG. 2, it is necessary to make the respective design data at the data design stage. At the data design stage, generally, a so-called design rule check (DRC) is carried out in order to determine whether or not the respective design patterns 1, 2, 3, 4, 5 have been drawn in accordance with design rules determined in advance. In this design rule check, for example, checks on the pattern widths w and the adjacent space widths s of the respective design patterns 1, 2, 3, 4, 5, or the like, are carried out. Accordingly, at the time of carrying out the design rule check, the respective mark patterns 7, 8, 9, 10, 11 (mark layers) may be generated. Or, tools dedicated for generating mark patterns which are separated from the tools for design rule check are made, and the respective mark patterns 7, 8, 9, 10, 11 may be generated thereby.

Next, respective steps of a so-called mask pattern data processing stage (mask pattern data making stage) at the side lower than the broken line shown in FIG. 5 will be described. The respective design data of the respective design patterns 1, 2, 3, 4, 5 and the respective mark patterns 7, 8, 9, 10, 11 shown in FIG. 2 which have been made at the data design stage are transmitted to the mask pattern data making stage which will be described as follows. Then, at the mask pattern data making stage, appropriate mask pattern data making processings are started with respect to the respective design data of the respective design patterns 1, 2, 3, 4, 5 and the respective mark patterns 7, 8, 9, 10, 11.

First, design data of a plurality of mask patterns 13, 14, 15, 16, 17 for forming the design patterns 1, 2, 3, 4, 5, respectively, as mask patterns 13, 14, 15, 16, 17 on a mask 18 are made. More specifically, design data of the respective temporary mask patterns 13, 14, 15, 16, 17 are made once on the basis of the design data of the respective design patterns 1, 2, 3, 4, 5 including the design data of the respective mark patterns 7, 8, 9, 10, 11 which have been made in Step 6. This is regarded as Step 7.

Next, corrections corresponding to the of the respective mark patterns 7, 8, 9, 10, 11 are applied with respect to the respective correction portions 1a, 2a, 2b, 3a, 3b of the respective correction object patterns 1, 2, 3. At that time, the contents of corrections (correction rules) set in advance for each of the mark patterns 7, 8, 9, 10, 11 are read. Then, appropriate corrections are applied onto the correction portions 1a, 2a, 2b, 3a, 3b of the correction object patterns 1, 2, 3 in accordance with the correction rules. In the embodiment, corrections in which the edge portions 1a, 2a, 2b, 3a, 3b which are the correction portions of the correction object patterns 1, 2, 3 are respectively moved by appropriate amounts and in appropriate directions are carried out on the basis of the respective mark patterns 7, 8, 9, 10, 11. Note that the corrections are carried out in the design data of the respective temporary mask patterns 13, 14, 15, 16, 17 which have been made in Step 7. This is regarded as Step 8.

In this Step 8 (mask pattern correction step), the design data of the respective design patterns 1, 2, 3, 4, 5 can be corrected on the basis of at least one of the correction rules determined in advance and unillustrated generation models.

In order to rapidly execute the corrections, for example, it is necessary to determine correction rules (contents of corrections) corresponding to the respective mark patterns 7, 8, 9, 10, 11. As described above, in the embodiment, the corrections in which the edge portions 1a, 2a, 2b, 3a, 3b are respectively moved by appropriate amounts on the basis of the respective mark patterns 7, 8, 9, 10, 11. Accordingly, in order to rapidly move the edge portions 1a, 2a, 2b, 3a, 3b by appropriate amounts, it is necessary to make the edge correction amounts (edge movement amounts) corresponding to the mark patterns 7, 8, 9, 10, 11 into rules in advance.

The edge correction amounts (edge movement amounts) made into rules corresponding to the mark patterns 7, 8, 9, 10, 11 in the embodiment are shown in FIG. 4. In this Step 8, not only the mark patterns 7, 8, 9, 10, 11 generated on the respective edge portions 1a, 2a, 2b, 3a, 3b are recognized, but also the edge correction amounts with respect to the respective edge portions 1a, 2a, 2b, 3a, 3b set for each of the mark patterns 7, 8, 9, 10, 11 are read. Then, the edge portions 1a, 2a, 2b, 3a, 3b are moved by predetermined accounts set in advance in accordance with the read correction amounts. Here, for example, suppose that the adjacent space widths s between the respective correction objecty patterns 1, 2, 3 and the respective interference patterns 1, 2, 3, 4, 5 which are adjacent thereto are relatively large values of about several ten μm to several mm. Even in such a case, according to the method described above, merely if the respective mark patterns 7, 8, 9, 10, 11 disposed in the vicinity of the respective edge portions 1a, 2a, 2b, 3a, 3b of the respective correction object patterns 1, 2, 3 are searched, the edge portions 1a, 2a, 2b, 3a, 3b can be rapidly moved by appropriate amounts in accordance with the mark patterns 7, 8, 9, 10, 11. Namely, in accordance with the pattern correcting method of the embodiment, merely if mark patterns disposed at a short distance from correction object patterns are searched, appropriate correction amounts with respect to the correction object patterns can be determined on the basis of the layout information of the interference patterns disposed as a long distance from the correction object patterns.

Next, design data of the respective mask patterns 13, 14, 15, 16, 17 actually formed on the mask 18 are made. More specifically, the design data of the respective mask patterns 13, 14, 15, 16, 17 actually formed on the mask 18 are made on the basis of the design data of the respective temporary mask patterns 13, 14, 15, 16, 17 onto which the appropriate corrections have been applied in Step 8. This is regarded as Step 9.

Next, the mask patterns 13, 14, 15, 16, 17 are formed on the mask 18 on the basis of the design data of the respective corrected mask patterns 13, 14, 15, 16, 17 for forming actual mask patterns which have been formed in Step 9. Namely, the mask 18 for transferring patterns is made. This is regarded as Step 10.

Then, the desired design patterns 1, 2, 3, 4, 5 set in advance are formed on the semiconductor substrate (wafer) 12 by using the mask 18 formed in Step 9. To describe concretely, exposure operations are carried out by using the mask 18, and the mask patterns 13, 14, 15, 16, 17 formed on the mask 18 are transferred onto a resist film 19 provided on the wafer 12. Thereafter, the corrected desired mask patterns 13, 14, 15, 16, 17 are respectively formed as resist patterns on the wafer 12 via a normal development process, an etching process, a resist film eliminating process, and the like. This is regarded as Step 11.

The wafer 12 having the desired mask patterns 13, 14, 15, 16, 17 formed onto the surface thereof is obtained via Step 1 to Step 11 described above. Namely, the wafer 12 is obtained in which the respective design patterns (respective resist patterns) 1, 2, 3, 4, 5 have been highly precisely formed onto the surface thereof within a range of allowable errors so as to be substantially the same as the dimensions, the shapes, and the layouts which have been set at the design stages thereof. Thereafter, detailed descriptions and illustrations will be omitted. However, a semiconductor device having the wafer 12 on which the desired design patterns 1, 2, 3, 4, 5 have been formed is obtained via a normal dicing process, a mounting process, a bonding process, a packaging process, and the like.

Note that, before and after the correction in Step 8 is executed, corrections for correcting process conversion differences (errors) which occur in other processes than the respective processes shown in the flowchart of FIG. 5 may be executed. Namely, before and after corrections according to the mark patterns 7, 8, 9, 10, 11 with respect to the design data of the mask patterns 13, 14, 15, 16, 17 are executed, other corrections may be executed with respect to the design data of the mask patterns 13, 14, 15, 16, 17. For example, as shown by surrounding by a frame of broken line in FIG. 5, other first corrections may be carried out between Step 7 and Step 8. Or, as shown by surrounding by a frame of broken line in FIG. 5 in the same way, other second corrections may be carried out between Step 8 and Step 9. Moreover, those other first corrections and second corrections may be respectively carried out successively before and after Step 8. The contents of corrections such as correction techniques and correcting methods which are executed in the respective corrections in those other first corrections and second corrections are appropriately set to proper contents in accordance with a type of a process such as a masking process, a lithography process, an etching process, and the like. In accordance therewith, the process conversion differences (errors) which occur in the other processes than the respective processes shown in the flowchart of FIG. 5 can be corrected at a more high speed and more smoothly, and more highly precisely.

Next, a pattern correction system 20 according to the embodiment will be described with reference to mainly FIG. 6. The pattern correction system 20 is to execute the pattern correcting method shown in FIG. 5 described above.

As shown in FIG. 6, the pattern correction system 20 comprises a mark pattern generating apparatus 21 and a mask pattern data processing apparatus 22. Generation rules of the respective design data of the design patterns 1, 2, 3, 4, 5 and the design data of the respective mark patterns 7, 8, 9, 10, 11 are inputted to the mark pattern generating apparatus 21. The mark pattern generating apparatus 21 generates the respective design data of the mark patterns 7, 8, 9, 10, 11 on the basis of the inputted generation rules so as to be associated with the respective design data of the edge portions 1a, 2a, 2b, 3a, 3b within a region at which those are processed collectively along with the respective design data of the edge portions 1a, 2a, 2b, 3a, 3b of the correction object patterns 1, 2, 3, (Step 5). Then, the mark pattern generating apparatus 21 makes the respective design data of the respective design patterns 1, 2, 3, 4, 5 (respective temporary mask patterns 13, 14, 15, 16, 17) including the respective edge portions 1a, 2a, 2b, 3a, 3b of the respective correction object patterns 1, 2, 3 which have been associated with the mark patterns 7, 8, 9, 10, 11 (Step 6). Namely, the mark pattern generating apparatus 21 executes Step 1 to Step 6 corresponding to the data design stage at the side upper than the broken line among Step 1 to Step 11 shown in the flowchart of FIG. 5.

The respective design data of the mark patterns 7, 8, 9, 10, 11 are inputted to the mask pattern data processing apparatus 22. In addition thereto, the respective design data of the respective design patterns 1, 2, 3, 4, 5 including the respective edge portions 1a, 2a, 2b, 3a, 3b of the respective correction object patterns 1, 2, 3, which have been made in the mark pattern generating apparatus 21, and which have been associated with the respective mark patterns 7, 8, 9, 10, 11 are inputted to the mask pattern data processing apparatus 22. The mask pattern data processing apparatus 22 corrects the respective design data of the edge portions 1a, 2a, 2b, 3a, 3b, on the basis of the inputted design data, in accordance with the contents of corrections described in the respective design data of the mark patterns 7, 8, 9, 10, 11. To describe more in detail, the corrections corresponding to the mark patterns 7, 8, 9, 10, 11 are carried out by a mask pattern data correcting apparatus 23 provided in the mask pattern data processing apparatus 22. The mask pattern data correcting apparatus 23 reads the contents of corrections (correction rules) determined in advance for each of the mark patterns 7, 8, 9, 10, 11 at the time of correcting the respective design data of the edge portions 1a, 2a, 2b, 3a, 3b. Then, the mask pattern data correcting apparatus 23 moves the respective design data of the respective edge portions 1a, 2a, 2b, 3a, 3b of the respective correction object patterns 1, 2, 3 which have been associated with the respective mark patterns 7, 8, 9, 10, 11 by appropriate amounts on the basis of the mark patterns 7, 8, 9, 10, 11 and the read correction rules.

Subsequently, the mask pattern data processing apparatus 22 makes the respective design data of the mask patterns 13, 14, 15, 16, 17 actually formed on the mask 18 on the basis of the respective design data of the temporary mask patterns 13, 14, 15, 16, 17 including the respective design data of the edge portions 1a, 2a, 2b, 3a, 3b to which corrections have been applied (Step 9). To describe more in detail, the makings of the respective design data of the mask patterns 13, 14, 15, 16, 17 actually formed on the mask 18 are carried out by a mask pattern data making apparatus 24 provided in the mask pattern data processing apparatus 22. Then, the mask pattern data processing apparatus 22 outputs the respective design data of the mask patterns 13, 14, 15, 16, 17 actually formed on the mask 18 which have been made by the mask pattern data making apparatus 24. In this way, the mask pattern data processing apparatus 22 executes Step 7 to Step 9 at the mask pattern data processing stage (mask pattern data making stage) at the side lower than the broken line, among Step 1 to Step 11 shown in the flowchart of FIG. 5.

Note that, at the mask pattern data processing stage, in a case of executing the other first corrections and the other second corrections described above, as shown by surrounding by the frames of the broken lines in FIG. 6, it is recommended that another first correction apparatus 25 and another second correction apparatus 26 are provided inside the mask pattern data processing apparatus 22. Accordingly, process conversion differences (errors) which occur in the other processes than the respective processes shown in the flowchart of FIG. 5 can be corrected at a more high speed and more smoothly, and even more highly precisely by using the pattern correction system 20.

Next, a pattern correction program according to the embodiment, and a recording medium 28 which is readable by a computer 27, and on which the pattern correction program has been recorded will be described with reference to mainly FIG. 7. The pattern correction program and recording medium 28 execute the pattern correcting method shown in FIG. 5 described above. To describe more concretely, the pattern correction program and the recording medium 28 according to the embodiment operate the pattern correction system 20 shown in FIG. 6 described above, and control the operations thereof to execute the pattern correcting method shown in FIG. 5. Namely, the pattern correction system 20 can be realized by the computer 27 as well which reads the pattern correction program recorded on the recording medium 28 such as, for example, a magnetic disk, an optical disk, or a semiconductor memory, and in which the operations are controlled by the program. As described above, the pattern correcting method of the embodiment corresponding to Step 1 to Step 9 shown in FIG. 5 is a data processing step in which all the processes can be substantially processed by the computer 27. Accordingly, the pattern correction system itself executing Step 1 to Step 9 shown in FIG. 5 can be regarded as the computer 27. Hereinafter, it will be described such that the pattern correction system 20 itself is regarded as the computer 27.

In FIG. 7, to be brief, the respective data input units of the mark pattern generating apparatus 21, the mask pattern data processing apparatus 22, the mask pattern data correcting apparatus 23, the mask pattern data making apparatus 24, the other first correction apparatus 25, and the other second correction apparatus 26, which the pattern correction system 20 has, are collectively shown simply as an input unit 29 of the computer 27. In the same way, the respective data output units of the mark pattern generating apparatus 21, the mask pattern data processing apparatus 22, the mask pattern data correcting apparatus 23, the mask pattern data making apparatus 24, the other first correction apparatus 25, and the other second correction apparatus 26 are collectively shown simply as an output unit 30 of the computer 27. Further in the same way, the respective data storage units of the mark pattern generating apparatus 21, the mask pattern data processing apparatus 22, the mask pattern data correcting apparatus 23, the mask pattern data making apparatus 24, the other first correction apparatus 25, and the other second correction apparatus 26, and a program storage unit of the pattern correction system 20 which stores the pattern correction program read from the recording medium 28 are collectively shown simply as a storage unit 31 of the computer 27. Further, in the same way, the respective arithmetic processing units (data processing units, program executing units) of the mark pattern generating apparatus 21, the mask pattern data processing apparatus 22, the mask pattern data correcting apparatus 23, the mask pattern data making apparatus 24, the other first correction apparatus 25, and the other second correction apparatus 26, and an arithmetic processing unit (data processing unit, program executing unit) of the pattern correction system 20 which stores the pattern correction program read from the recording medium 28 are collectively shown simply as a CPU 32 of the computer 27.

As shown by an outlined arrow in FIG. 7, the computer 27 (pattern correction system 20) is made to read the pattern correction program recorded on the recording medium 28. More specifically, the CPU 32 of the computer 27 (mark pattern generating apparatus 21) is made to read the pattern correction program recorded on the recording medium 28 via the input unit 29 of the computer 27 (mark pattern generating apparatus 21). The pattern correction program read by the CPU 32 is transmitted from the CPU 32 to the computer 27 to be stored. Further, the generation rules of the respective design data of the design patterns 1, 2, 3, 4, 5, and the respective design data of the mark patterns 7, 8, 9, 10, 11 are inputted to and stored in the storage unit 31 of the computer 27 (mark pattern generating apparatus 21) via the input unit 29.

The CPU 32 executes the pattern correction processing on the basis of the pattern correction program stored in the storage unit 31. To describe concretely, first, design data corresponding to the respective correction portions (edge portions) 1*a*, 2*a*, 2*b*, 3*a*, 3*b* are extracted from the respective design data of the plurality of correction object patterns 1, 2, 3 in which portions to be corrected are included in at least one portions, among the respective design data of the design patterns 1, 2, 3, 4, 5 stored in the storage unit 31. Namely, the CPU 32 executes data extraction processing corresponding to Step 1 in FIG. 5. In addition, the CPU 32 acquires the layout information of the plurality of interference patterns 1, 2, 3, 4, 5 which have been provided on the peripheries of the correction object patterns 1, 2, 3, and which interfere with the correction object patterns 1, 2, 3, among the respective layout information of the design patterns 1, 2, 3, 4, 5 which have been stored in the storage unit 31. Namely, the CPU 32 executes layout information acquisition processing corresponding to Step 2 in FIG. 5.

Next, the CPU 32 determines the contents of appropriate corrections corresponding to the respective edge portions 1*a*, 2*a*, 2*b*, 3*a*, 3*b* on the basis of the layout information of the respective interference patterns 1, 2, 3, 4, 5. Namely, the CPU32 executes correction contents determination processing corresponding to Step 3 in FIG. 5. Additionally, the CPU 32 makes the design data of the plurality of mark patterns 7, 8, 9, 10, 11 in which the determined contents of corrections are executed onto the edge portions 1*a*, 2*a*, 2*b*, 3*a*, 3*b*, on the basis of the layout information of the interference patterns 1, 2, 3, 4, 5. Namely, the CPU 32 executes design data making processing of mark patterns corresponding to Step 4 in FIG. 5. Then, the CPU 32 generates the respective design data of the mark patterns 7, 8, 9, 10, 11 so as to be associated with the respective design data of the edge portions 1*a*, 2*a*, 2*b*, 3*a*, 3*b* within a range where those are processed collectively along with the respective design data of the edge portions 1*a*, 2*a*, 2*b*, 3*a*, 3*b*. In the embodiment, as described above, the CPU 32 generates the respective design data of the mark patterns 7, 8, 9, 10, 11 so as to be overlapped upon the respective design data of the edge portions 1*a*, 2*a*, 2*b*, 3*a*, 3*b*. Namely, the CPU 32 executes design data generation processing of mark patterns corresponding to Step 5 in FIG. 5.

Next, the CPU 32 makes the design data of the respective design patterns 1, 2, 3, 4, 5 over again so as to include the design data of the respective mark patterns 7, 8, 9, 10, 11. To describe concretely, the CPU 32 newly makes the respective design data of the respective design patterns 1, 2, 3, 4, 5 including the respective edge portions 1*a*, 2*a*, 2*b*, 3*a*, 3*b* of the respective correction object patterns 1, 2, 3 which have been associated with the mark patterns 7, 8, 9, 10, 11. Namely, the CPU 32 executes design data making processing corresponding to Step 6 in FIG. 5.

The respective processings by the CPU 32 described above are executed by the mark pattern generating apparatus 21 as described above. Namely, the respective processings corresponding to Step 1 to Step 6 in the data design stage shown in FIG. 5 are executed by, concretely, the CPU 32 of the mark pattern generating apparatus 21, among the CPUs 32 which the computer 27 (pattern correction system 20) has. The setting is recommended that the respective design data of the mark patterns 7, 8, 9, 10, 11 made by the CPU 32 of the mark pattern generating apparatus 21, and the respective design data of the new design patterns 1, 2, 3, 4, 5 which have been associated with the mark patterns 7, 8, 9, 10, 11 are appropriately stored (preserved) in the storage unit 31 of the mark pattern generating apparatus 21.

The respective design data of the mark patterns 7, 8, 9, 10, 11 made by the CPU 32 of the mark pattern generating apparatus 21, and the respective design data of the new design patterns 1, 2, 3, 4, 5 are inputted to the input unit 29 of the mask pattern data processing apparatus 22 (computer 27) via the output unit 30 of the mark pattern generating apparatus 21. The respective design data of the mark patterns 7, 8, 9, 10, 11, and the respective design data of the new design patterns 1, 2, 3, 4, 5 inputted via the input unit 29 are once stored in the storage unit 31 of the mask pattern data processing unit 22 via the CPU 32 of the mask pattern data processing apparatus 22, and predetermined processings are applied thereto by the CPU 32.

The CPU 32 of the mask pattern data processing apparatus 22 once makes the design data of the temporary mask patterns 13, 14, 15, 16, 17, on the basis of the respective design data of the mark patterns 7, 8, 9, 10, 11 and the respective design data of the new design patterns 1, 2, 3, 4, 5 inputted from the mark pattern generating apparatus 21. Namely, the CPU 32 executes design data making processing of temporary mask patterns corresponding to Step 7 in FIG. 5.

Next, the CPU 32 of the mask pattern data processing apparatus 22 applies appropriate corrections onto the respective design data of the respective temporary mask patterns 13, 14, 15, 16, 17. To describe concretely, the CPU 32 of the mask pattern data correcting apparatus 23 provided in the mask pattern data processing apparatus 22 moves the respective edge portions 1*a*, 2*a*, 2*b*, 3*a*, 3*b* of the respective correction object patterns 1, 2, 3 by appropriate amounts on the basis of the contents of corrections described in the respective design data of the mark patterns 7, 8, 9, 10, 11. At that time, the CPU 32 of the mask pattern data correcting apparatus 23 reads the contents of corrections (correction rules) which have been determined in advance for each of the mark patterns 7, 8, 9, 10, 11, via the input unit 29. Then, the CPU 32 of the mask pattern data correcting apparatus 23 moves the respective design data of the edge portions 1*a*, 2*a*, 2*b*, 3*a*, 3*b* of the correction object patterns 1, 2, 3 which have been associated with the respective mark patterns 7, 8, 9, 10, 11, by appropriate amounts, on the basis of the mark patterns 7, 8, 9, 10, 11 and the read correction rules. Namely, the CPU 32 of the mask pattern data correcting apparatus 23 executes design data correction processing of temporary mask patterns corresponding to Step 8 in FIG. 5. The setting is recommended that the respective design data of the temporary mask patterns 13, 14, 15, 16, 17 to which the corrections have been applied by the CPU 32 of the mask pattern data correcting apparatus 23 are appropriately stored (preserved) in the storage unit 31 of the mask pattern data correcting apparatus 23 (mask pattern data processing apparatus 22).

Next, the CPU 32 of the mask pattern data processing apparatus 22 makes design data of the mask patterns 13, 14, 15, 16, 17 actually formed on the mask 18. The respective design data of the temporary mask patterns 13, 14, 15, 16, 17 to which the corrections have been applied by the CPU 32 of the mask pattern data correcting apparatus 23 are inputted to the input unit 29 of the mask pattern data making apparatus 24 provided in the mask pattern data processing apparatus 22 via the output unit 30 of the mask pattern data correcting apparatus 23. The respective design data of the temporary mask patterns 13, 14, 15, 16, 17 onto which the corrections have been applied, and which have been inputted via the input unit 29 are once stored in the storage unit 31 of the mask pattern data making apparatus 24 via the CPU 32 of the mask pattern data making apparatus 24, and predetermined processings are applied thereto by the CPU 32. More specifically, the CPU 32 of the mask pattern data making apparatus 24 makes the design data of the mask patterns 13, 14, 15, 16, 17 actually formed on the mask 18 on the basis of the design data of the temporary mask patterns 13, 14, 15, 16, 17 onto which the corrections have been applied. Namely, the CPU 32 of the mask pattern data making apparatus 24 executes design data making processing of actual mask patterns corresponding to Step 9 in FIG. 5. The setting is recommended that the respective design data of the actual mask patterns 13, 14, 15, 16, 17 made by the CPU 32 of the mask pattern data making apparatus 24 are appropriately stored (preserved) in the storage unit 31 of the mask pattern data making apparatus 24 (mask pattern data processing apparatus 22).

Thereafter, the respective design data of the actual mask patterns 13, 14, 15, 16, 17 made by the CPU 32 of the mask pattern data making apparatus 24 are outputted to the exterior of the computer 27 (pattern correction system 20) via the output unit 30 of the mask pattern data making apparatus 24 (mask pattern data processing apparatus 22). For example, the respective design data of the actual mask patterns 13, 14, 15, 16, 17 made by the CPU 32 of the mask pattern data making apparatus 24 are inputted to a mask pattern forming apparatus (mask forming apparatus) (not shown) which forms the respective mask patterns 13, 14, 15, 16, 17 on the mask 18 on the basis thereof.

As described above, the respective processings corresponding to Step 7 to Step 9 at the mask pattern data processing stage (mask pattern data making stage) shown in FIG. 5 are executed by the respective CPUs 32 of the mask pattern data correcting apparatus 23 and the mask pattern data making apparatus 24 which the mask pattern data processing apparatus 22 has, among the CPUs 32 which the computer 27 (pattern correction system 20) has.

Note that, when the other first corrections and the other second corrections described above are executed at the mask pattern data processing stage, as shown by surrounding by the broken lines in FIG. 6, it is recommended that the other first correction apparatus 25 and the other second correction apparatus 26 are provided inside the mask pattern data processing apparatus 22. Then, the setting is recommended that the correction processings by the other first correction apparatus 25 and the other second correction apparatus 26, and the input and output of data required for the correction processings are carried out by the respective input units 29, the output units 30, the storage units 31, and the CPUs 32 of the other first correction apparatus 25 and the other second correction apparatus 26. In accordance therewith, process conversion differences (errors) which occur in the other processes than the respective processes shown in the flowchart of FIG. 5 can be corrected at a more high speed and more smoothly, and even more highly precisely, by using the pattern correction program (the pattern correction system 20, the computer 27).

Further, the techniques described in the embodiment can be applied to various apparatuses by being written, as a program which can be executed by the computer 27, into the recording medium 28 which is a magnetic disk such as a flexible disk or a hard disk, an optical disk such as a CD, a DVD or an MO, a semiconductor memory, or the like, or can be applied to various apparatuses by being transmitted via communication media. The computer 27 realizing the pattern correcting apparatus (pattern correction system 20) described above reads the pattern correction program recorded in the various recording media 28, and executes the processings described above due to the operations being controlled by the pattern correction program.

As the storage unit 31 of the computer 27 described above, it is preferable that a recording medium (recording apparatus) on which data and program to be recorded therein are rewritable (updatable) appropriately, which is a magnetic disk such as a flexible disk or a hard disk, an optical disk such as a CD, a DVD or an MO, a semiconductor memory, or the like is used.

As described above, according to the pattern correcting method, the pattern correction system, the pattern correction program, and the computer-readable recording medium having the pattern correction program recorded therein, regardless of the distances between the design patterns 1, 2, 3, 4, 5 formed on the substrate 12 and the interference patterns 1, 2, 3, 4, 5 which generate errors by interfering with the design patterns 1, 2, 3, 4, 5, due to the data processing efficiency being improved by suppressing times and data amounts required for corrections onto the correction portions 1a, 2a, 2b, 3a, 3b of the correction object patterns 1, 2, 3, the design patterns 1, 2, 3, 4, 5 can be formed highly precisely and efficiently, and easily, so as to be desired design dimensions (design sizes, design shapes, design patterns). Further, in accordance with the masks and the forming method therefor according to the embodiment, desired patterns can be highly precisely formed. Further, the semiconductor device according to the embodiment has a semiconductor substrate on which patterns have been high precisely formed, and thus has a high yield, and is low-priced. Moreover, according to the method of manufacturing the semiconductor device of the embodiment, the semiconductor device which has a semiconductor substrate on which patterns have been high precisely formed, has a high yield, and is low-priced can be manufactured efficiently, easily, and at a low cost.

As described in BACKGROUND OF THE INVENTION, the advance of the semiconductor manufacturing technology in recent years is extremely remarkable, and semiconductor devices having a minimum processing dimension of about 0.13 μm size have been produced in large quantities. Such miniaturization has been realized by the rapid progress in the micro- pattern forming technology such as, so-called, mask process technology, optical lithography technology, and etching technology. In the time when a pattern size is sufficiently large, first, a plane shape of an LSI pattern to be formed on a wafer is drawn as is as a design pattern. Then, a mask pattern which is faithful to the design pattern is made. Next, the mask pattern is transferred onto the wafer by an exposure apparatus (projection optical system). Thereafter, the pattern as substantially same as the design pattern can be formed on the wafer by etching the undercoating on which the design pattern has been transferred.

However, as the miniaturization of patterns has progressed, it has been made difficult to form patterns faithfully so as to be the same as the design patterns in a series of the processes of manufacturing a semiconductor device. This results in the problem that final finished dimensions are not the same as the design patterns. In order to solve such a problem, a technology in which mask patterns different from the design patterns are made such that the final finished dimensions are made equal to the design pattern dimensions in consideration of conversion differences (errors) in the respective processes (mask data processing technology) has been made extremely important.

As the mask data processings, there are some types in addition to the process proximity correction (PPC) processing described above. For example, there is mask data processing (MDP) in which a mask pattern is varied by using graphic arithmetic processing, design rule checker (DRC), or the like. Or, there is optical proximity correction (OPC) processing in which a variation in dimensions brought about in a lithography process is corrected by the pattern by adding a dummy pattern to a design pattern in advance, or the like. By carrying out these mask data processings, mask patterns can be appropriately corrected such that the final finished dimensions are made so as to be the same as desired design dimensions (design sizes, design shapes, design patterns) on the wafer.

Among the mask data processings described above, for example, the PPC is broadly divided into two techniques. One is processing called a rule-based PPC in which correction rules are made in advance depending on features of patterns such as the widths of the patterns, the intervals between adjacent patterns, and the like, and the feature places are corrected in accordance with the rules. The other one is processing called model-based PPC in which a plane shape of patterns on the wafer is estimated by using a simulator which estimates the finished plane shape of a pattern on a wafer, and the pattern is corrected such that the estimated plane shape of the pattern is made to coincide with the design pattern.

Moreover, in recent years, a correction technique using the rule-based PPC technique and the model-based PPC technique so as to be combined together depending on a characteristic of a process has been proposed. As one example thereof, Jpn. Pat. Appln. KOKAI Publication No. 11-102062 discloses a technology in which conversion differences which occur in an etching process, a lithography process, and a mask process are corrected by using correction techniques different at each stage of the processes. More specifically, a rule-based correction technique is used with respect to a conversion difference occurring in an etching process, and a model-based correction technique is used with respect to conversion differences occurring in a lithography process and a mask process. In this way, the PPC techniques are switched for each process in order to be able to carry out an appropriate correction depending on a characteristic of each process. However, in the technology in Jpn. Pat. Appln. KOKAI Publication No. 11-102062, a conversion difference caused by another pattern disposed at a position relatively distant from a correction object pattern of about several 10 μm to several mm from the correction object pattern cannot be corrected. A technology in which such a conversion difference due to a long-distant pattern is avoided is disclosed in Jpn. Pat. Appln. KOKAI Publication No. 2003-17390 as described above. This technology is to reduce variations in layouts of patterns at a long distance from the correction object pattern by inserting a dummy pattern, thereby reducing the effect on a conversion difference from a long distance.

However, in some cases, dummy patterns cannot be disposed depending on a device. In this case, the effect on a conversion difference from a long distance cannot be reduced by the technology in Jpn. Pat. Appln. KOKAI Publication No. 2003-17390 described above. Accordingly, another technique for correcting the effect form a pattern disposed at a long distance is required.

However, when a pattern is corrected in consideration of the effect from a pattern disposed at a long distance from a correction object pattern, two problems described as follows will be brought about. One is the problem that, because it is necessary to estimate the effects from patterns disposed at a long distance from correction object patterns for each correction object pattern, and to determine correction values in accordance with each effect, a time until the correction values (correction amounts) with respect to the correction object patterns are determined increases as distances from the correction object patterns increase. The other one is the problem that, for example, when the design data have hierarchical structures, more data are expanded as distances from the correction object patterns which are referred with at the time of correction increase, and thus, there is a great concern that an increase in a processing time required for corrections and an remarkable increase in a data amount which must be considered of are brought about.

These problems bring about increases in a PPC processing time, a PPC verification time, a mask drawing time, and the like, which greatly affect a turn around time (TAT) in making devices. As a result, there is a great concern that a reduction in the production efficiency and steep rise in the production cost of a semiconductor device are brought about.

In contrast thereto, according to the embodiment as described above, the respective mark patterns 7, 8, 9, 10, 11 are disposed in the vicinity of the respective correction object patterns 1, 2, 3 on the basis of the respective layout information of the interference patterns 1, 2, 3, 4, 5 which are relatively distant, such as several 10 μm to several mm, from the correction object patterns 1, 2, 3. To describe concretely, the respective mark patterns 7, 8, 9, 10, 11 are disposed so as to be overlapped upon the respective edge portions 1a, 2a, 2b, 3a, 3b which are the correction portions of the correction object patterns 1, 2, 3. Then, appropriate corrections can be applied onto the respective edge portions 1a, 2a, 2b, 3a, 3b of the respective correction object patterns 1, 2, 3, in accordance with the respective mark patterns 7, 8, 9, 10, 11. Namely, highly-precise corrections in consideration of the layout information of the interference patterns 1, 2, 3, 4, 5 which are relatively distant can be carried out by merely determining the respective mark patterns 7, 8, 9, 10, 11 in the vicinity of the respective correction object patterns 1, 2, 3. As a result, it is possible to realize the high precision in corrections onto the patterns at a high speed and easily without increasing a data amount and a time required for corrections.

In accordance with the memory device manufacturing experiments carried out by the inventors, it has been confirmed that, provided that a time (speed) and a data size required for corrections in the correction technology relating to BACKGROUND OF THE INVENTION are respectively 1, a time (speed) and a data size required for corrections in the embodiment are respectively made about 0.3 and about 0.2.

SECOND EMBODIMENT

Figure 8:
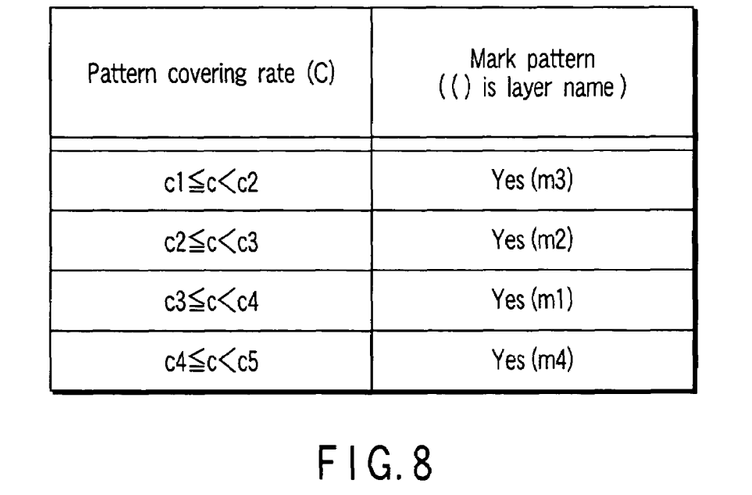
FIG. 8 is a table showing generation rules of mark patterns, which are based on pattern covering rates, according to a second embodiment of the invention.

Next, a second embodiment according to the invention will be described with reference to FIG. 8. FIG. 8 is a table showing generation rules for mark patterns based on pattern covering rates according to the embodiment. Note that, in the following descriptions, portions which are the same as those in the first embodiment are denoted by the same reference numerals, and detailed descriptions thereof will be omitted.

In the embodiment, only the point in which the mark pattern (mark layer) generation rules are made depending on pattern covering rates is different from the first embodiment described above, and the others are the same in the first embodiment.

As shown in FIG. 8, in the embodiment, mark pattern (mark layer) generation rules are separately set for each pattern covering rate (c). Here, the pattern covering rates are defined as ratios of areas for which all the design patterns 1, 2, 3, 4, 5, all the interference patterns 1, 2, 3, 4, 5, and all the mark patterns 7, 8, 9, 10, 11 which have been included in the region account, with respect to the areas within predetermined regions (ranges) from the correction object patterns 1, 2, 3. In the embodiment, as shown in FIG. 8, the pattern covering rates (c) are classified into five stages of c1, c2, c3, c4, c5.

By setting the mark pattern generation rules in this way, the contents of corrections (correcting methods, correction amounts) with respect to the respective correction portions 1a, 2a, 2b, 3a, 3b of the respective correction object patterns 1, 2, 3 can be easily set to be in an appropriate state depending on a pattern covering rate. In this case, the mark pattern generation rules shown in FIG. 3 are regarded as types of mark patterns with respect to the pattern covering rates. In addition, the edge correction amounts corresponding to FIG. 4 are newly made again, and the correcting methods of the first embodiment are applied thereto. Consequently, corrections which are the same as those in the first embodiment can be carried out.

As described above, in accordance with the second embodiment, effects which are the same as in the first embodiment can be obtained. Further, in accordance with the experiments which have been carried out by the inventors, it could be confirmed that, even if the mark pattern generation rules and the edge correction amounts are newly defined over again with a combination of the second embodiment and the first embodiment, corrections onto the correction object patterns 1, 2, 3 can be carried out rapidly, highly precisely, and easily, by the same methods of the second embodiment and the first embodiment.

THIRD EMBODIMENT

Next, a third embodiment according to the invention will be described without reference to the drawings.

In the embodiment, a technology will be described in which corrections are carried out on the basis of the layout information of long-distant patterns (interference patterns) which are more distant from correction object patterns as compared with the first and second embodiments described above.

As described in BACKGROUND OF THE INVENTION, an error due to a short-distant pattern (an interference pattern) disposed at a region close such as about several μm from a correction object pattern can be sufficiently corrected by applying a conventional rule-based OPC technique or model-based OPC technique to the layout information of the short-distant pattern.

In contrast thereto, in the first and second embodiments described above, the respective mark patterns 7, 8, 9, 10, 11 are disposed in the vicinity of the respective correction object patterns 1, 2, 3, on the basis of the respective layout information of the respective interference patterns 1, 2, 3, 4, 5 which are relatively at a long distance, such as several ten μm to several mm, from the correction object patterns 1, 2, 3. Then, appropriate corrections can be applied to the respective edge portions 1a, 2a, 2b, 3a, 3b of the respective correction object patterns 1, 2, 3, in accordance with the mark patterns 7, 8, 9, 10, 11. Namely, by merely determining the mark patterns 7, 8, 9, 10, 11 in the vicinity of the correction object patterns 1, 2, 3, highly-precise corrections in consideration of the layout information of the interference patterns 1, 2, 3, 4, 5, which are relatively a long distance can be carried out.

In particular, suppose that a wavelength of an unillustrated exposure light for use in exposing the correction object patterns 1, 2, 3 is λ, and a number of apertures of a lens is NA. Then, for example, setting is made in which the layout information of the interference patterns 1, 2, 3, 4, 5 provided at regions which are 1.3×(λ/NA) or more distant away from the correction object patterns 1, 2, 3 are acquired by the mark pattern generating apparatus 21. Consequently, appropriate corrections can be applied to the edge portions 1a, 2a, 2b, 3a, 3b of the correction object patterns 1, 2, 3, on the basis of the layout information of the interference patterns (long-distant patterns) 1, 2, 3, 4, 5 which are more distant away from the correction object patterns 1, 2, 3.

For example, when an attempt is made to determine the layout information of the interference patterns which are about several ten μm to several mm distant away from the correction object patterns by the various correcting methods described in BACKGROUND OF THE INVENTION, the mask data processing takes an enormous time. In particular, when the design data of the interference patterns have hierarchical structures, data amounts required for correction processings are explosively increased, and the time required for the corrections is made extremely long. As a result, the corrections are made extremely unsuitable for being used for a field of manufacturing a semiconductor device, and unable to be practically used, which may be a reason that the production efficiency and the yield of the semiconductor device are remarkably reduced, and the manufacturing cost of the semiconductor device is steeply raised.

In contrast thereto, according to the embodiment, the vicinity of the correction object patterns 1, 2, 3 is merely observed, and whereby the layout information of the interference patterns (long-distant patterns) 1, 2, 3, 4, 5 which are extremely distant from the correction object patterns 1, 2, 3 can be determined. Accordingly, without hardly bringing about problems as described above, and regardless of the distances between the design patterns 1, 2, 3, 4, 5 and the respective long-distant interference patterns 1, 2, 3, 4, 5, highly-precise corrections can be applied onto the correction portions 1a, 2a, 2b, 3a, 3b of the correction object patterns 1, 2, 3.

As described above, according to the third embodiment, effects which are the same as those in the first and second embodiments described above can be obtained. Further, as compared with the first and second embodiments described above, highly-precise corrections can be applied onto the edge portions 1a, 2a, 2b, 3a, 3b of the correction object patterns 1, 2, 3, on the basis of the layout information of the interference patterns (long-distant patterns) 1, 2, 3, 4, 5 which are more distant away from the correction object patterns 1, 2, 3.

Note that the pattern correcting method, the pattern correction system, the pattern correction program, the mask making method, and the method of manufacturing a semiconductor device according to the invention are not limited to the first to third embodiments described above. Those can be executed within a range which does not deviate from the gist of the invention such that some of those methods, systems, programs, configurations, manufacturing processes and the like are varied to be in a wide variety of settings, or various settings can be appropriately combined properly to be used.

For example, as described in the first embodiment, Step 3, Step 4, and Step 5 may be in the setting in which those are collectively processed in the same step. In the same way, not only Step 3, Step 4, and Step 5, the respective steps of Step 1 to Step 11 may be in the setting in which those are collectively processed in the same step by being appropriately combined properly.

Further, not only the mark patterns are generated at the data design stage, but also the mark patterns can be generated in one step at the mask pattern data processing stage. Further, in the first to third embodiments described above, it is assumed that a pattern exposure is carried out by an optical exposure. However, it is not limited thereto. For example, the present invention can be applied in the same way with respect to an electron beam exposure, an X-ray exposure, and an exposure by a ray having a wavelength in a range close to X-ray as well.

Further, in the above-described first embodiment, as shown in FIG. 2, the mark patterns 7, 8, 9, 10, 11 are generated respectively as different layers on the edge portions 1*a*, 2*a*, 2*b*, 3*a*, 3*b* of the correction object patterns 1, 2, 3. However, it is not necessarily limited to such a way of generating. The respective mark patterns 7, 8, 9, 10, 11 which are in forms to be identified for each generation rule determined in advance may be generated in any way. For example, the mark patterns 7, 8, 9, 10, 11 may be generated so as to be close to the correction portions 1*a*, 2*a*, 2*b*, 3*a*, 3*b* at the positions at which those are not overlapped upon the correction portions 1*a*, 2*a*, 2*b*, 3*a*, 3*b* of the respective correction object patterns 1, 2, 3. It is recommended that the design data of the mark patterns are generated so as to be associated with the design data of the correction portions within the regions where those are processed collectively along with the design data of the correction portions of the correction object patterns.

In the same way, the shapes of the mark patterns are not limited to rectangles as shown in FIG. 2. The shapes of the mark patterns may be formed in a wide variety of shapes such as an L shape, a concave shape, a convex shape, a triangle shape, a polygon shape, a round shape, and an elliptical shape depending on the contents of corrections. Further, in the same way, the dimensions and sizes of the mark patterns may be set to a wide variety of sizes depending on the contents of corrections thereof. It goes without saying that the precision, the speed, the ease, and the like in corrections are independent of the dimensions, the sizes, the shapes, and the like of the respective design patterns and the respective mark patterns.

Further, FIG. 2 shows the case in which the mark patterns for corrections are generated as different layers on the edge portions of the respective design patterns. However, there is no need to be necessarily the same. Provided that it is in a form in which the mark patterns for corrections can be identified for each rule shown in FIG. 3, the mark patterns for corrections may be generated in any way. Further, in FIG. 3, the methods of generating the mark layers (mark patterns) are made in rules for each of the pattern widths of the respective patterns and the space widths among the respective patterns. However, there is no need to be necessarily the same. In addition to the rules shown in FIG. 3, the methods of generating mark layers may be made in rules depending on a pattern covering rate on the periphery of a design pattern, a shape of a design pattern, and the like. For example, the methods of generating mark layers may be made in rules in accordance with a shape which is inherent to a pattern, such as corner portions of a design pattern, end portions of the lines of a design pattern, a line and space pattern (L/S pattern), and the like. Or, the methods of generating mark layers may be made in rules depending on a height of each deign pattern or the like. In accordance with the experiments carried out by the inventors, it could be confirmed that, as a result of making and exposing mask patterns (masks) on the basis of the mask pattern data corrected by using the mark patterns (mark layers) generated on the basis of such generation rules, design patterns can be highly precisely formed as desired on the wafer.

Furthermore, when other corrections are executed before and after Step 8 shown in the flowchart of FIG. 5, the types of the corrections are not limited to the other first corrections and the other second corrections. Further, when other corrections are executed before and after Step 8, a number of those corrections is not limited one time. For example, corrections other than the other first corrections may be carried out before Step 8. Or, yet corrections other than the other first corrections may be carried out before Step 8. Or, at least one of the other first corrections and the corrections other than the other first corrections may be respectively carried out a plurality of times before Step 8. Note that it goes without saying that the types of the corrections other than the other first corrections are not limited to one type. Namely, a plurality of types of corrections other than the other first corrections may be carried out before Step 8. These settings can be carried out in the same way in a case as well in which other corrections including the other second corrections are executed after Step 8.

Further, it goes without saying that the apparatuses, such as the other first correction apparatus and the other second correction apparatus, which the pattern correction system (mask pattern data processing apparatus) has, and which are for executing other corrections may be appropriately and properly recombined in order to appropriately execute those in accordance with the settings of the other corrections executed before and after Step 8. Moreover, it goes without saying that the settings of the contents of the pattern correction program and the computer (pattern correction system) in which the operations are controlled by the pattern correction program may be appropriately and properly recombined in order to appropriately execute those in accordance with the settings of the other corrections executed before and after Step 8.

Moreover, in accordance with the first to third embodiments, the pattern correcting method and the pattern correction system according to the invention may provide configurations and steps which will be described as follows.

For example, at least one of the sizes of the correction object patterns (first patterns, corrections patterns), the shapes of the correction object patterns, the intervals among the correction object patterns and the other patterns adjacent to the correction object patterns, and the pattern covering rates by the respective patterns (first design patterns) within predetermined ranges from the correction object patterns are included in the layout information of the interference patterns (second patterns).

In addition, the extraction of the design data of correction portions (correction patterns), the acquisition of the layout information of the interference patterns (second patterns), the determination of the contents of corrections, the making of the design data of the patterns for corrections (third patterns, design patterns-2), and the generation of the design data of the patterns for corrections are carried out at the time of making the design data of the respective patterns (first design patterns), and corrections onto the design data of the correction portions are carried out at the time of making the design data of the plurality of mask patterns for forming the patterns respectively as mask patterns onto the masks.

At least ones of the sizes and the layers of the patterns for corrections (third patterns, design patterns-2) are set separately depending on the layout information of the interference patterns (second patterns), and the patterns for corrections are classified depending on the layout information of the interference patterns.

Further, corrections onto the design data of the correction portions (correction patterns) are carried out successively two times or more.

Furthermore, the data processing apparatus corrects the design data of the correction portions (correction patterns) in accordance with the contents of corrections including in the design data of the patterns for corrections (third patterns, design patterns-2), and thereafter, makes the design data of the plurality of mask patterns for forming the patterns (first design patterns) respectively as mask patterns onto the masks, on the basis of the design data of the respective patterns including the correction object patterns (first patterns, correction patterns) onto which corrections have been applied.

In addition, the pattern generating apparatus makes at least one of the sizes of the correction object patterns (first patterns, correction patterns), the shapes of the correction object patterns, the intervals among the correction object patterns and the other respective patterns (first design patterns) adjacent to the correction object patterns, and the pattern covering rates by the respective patterns within predetermined ranges from the correction object patterns be included in the layout information of the interference patterns (second patterns).

The pattern generating apparatus also carries out the extraction of the design data of correction portions (correction patterns), the acquisition of the layout information of the interference patterns (second patterns), the determination of the contents of corrections, the making of the design data of the patterns for corrections (third patterns, design patterns-2), and the generation of the design data of the patterns for corrections, at the time of making the design data of the respective patterns (first design patterns), and carries out corrections onto the design data of the correction portions at the time of making the design data of the plurality of mask patterns for forming the patterns respectively as mask patterns onto masks.

The pattern correction system makes at least one of the sizes and the layers of the patterns for corrections (third patterns, design patterns-2) be set separately depending on the layout information of the interference patterns (second patterns), and classifies the patterns for corrections depending on the layout information of the interference patterns.

Further, the pattern generating apparatus carries out corrections onto the design data of the correction portions successively two times or more.

Moreover, accompanying that the steps and the configurations described above are applied to the first to third embodiments, the steps and configurations can be made to be in a wide variety of forms by being appropriately and properly applied to the pattern correction program, the mask making method, and the method of manufacturing a semiconductor device according to the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern correcting method comprising:
   extracting, at least one correction pattern being included in a first design pattern to be formed on a substrate;
   acquiring layout information from the first design pattern, the layout information affecting a finished plane shape of the correction pattern on the substrate;
   generating a design pattern-2 corresponding to the layout information so as to be associated with the correction pattern, the design pattern-2 including contents of correction on the basis of the layout information; and
   correcting the correction pattern in accordance with the contents of correction.

2. The method according to claim 1, wherein
   the layout information includes at least one of a size of the first design pattern, a shape of the first design pattern, an interval between predetermined said first design pattern and another said first design pattern adjacent to the predetermined said first design pattern, and a pattern covering rate by the first design pattern within a predetermined range from the predetermined said first design pattern.

3. The method according to claim 1, wherein
   the extraction of the correction pattern, the acquisition of the layout information, the determination of the contents of correction, and the generation of the design pattern-2 are carried out at a time of making the first design pattern, and
   the correction of the correction pattern is carried out at a time of making design data of the mask pattern to form the first design pattern as a mask pattern on a mask.

4. The method according to claim 1, wherein
   at least one of data related to a size of the design pattern-2 and data related to a placement of a layer of the design pattern-2 is set depending on the layout information, and
   data of the design pattern-2 is classified depending on the layout information.

5. The method according to claim 1, wherein
   the correction of the correction pattern is carried out successively two times or more.

6. The method according to claim 1, wherein
   given that a wavelength of an exposure light for use in exposing the first design pattern is $\lambda$, and a number of apertures of a lens is NA, the layout information is acquired from another said first design pattern provided at a region which is $1.3 \times (\lambda/NA)$ or more distant away from predetermined said first design pattern.

7. A mask making method comprising:
   forming a plurality of mask patterns by using a first design pattern, to be formed on a substrate and including at least one correction pattern, onto which correction has been applied by a pattern correcting method, the pattern correcting method comprising:
   extracting at least the one correction pattern;
   acquiring layout information from the first design pattern, the layout information affecting a finished plane shape of the correction pattern on the substrate;
   generating a design pattern-2 corresponding to the layout information so as to be associated with the correction pattern, the design pattern-2 including contents of correction on the basis of the layout information; and
   correcting the correction pattern in accordance with the contents of correction.

8. The method according to claim 7, wherein
   the layout information includes at least one of a size of the first design pattern, a shape of the first design pattern, an interval between predetermined said first design pattern and another said first design pattern adjacent to the predetermined said first design pattern, and a pattern covering rate by the first design pattern within a predetermined range from the predetermined said first design pattern.

9. The method according to claim 7, wherein
the extraction of the correction pattern, the acquisition of the layout information, the determination of the contents of correction, and the generation of the design pattern-2 are carried out at a time of making the first design pattern, and
the correction onto the correction pattern is carried out at a time of making design data of the mask pattern to form the first design pattern as a mask pattern on a mask.

10. The method according to claim 7, wherein at least one of data related to a size of the design pattern-2 and data related to a placement of a layer of the design pattern-2 is set depending on the layout information, and
data of the design pattern-2 is classified depending on the layout information.

11. The method according to claim 7, wherein
the correction onto the correction pattern is carried out successively two times or more.

12. The method according to claim 7, wherein
given that a wavelength of an exposure light for use in exposing the first design pattern is λ, and a number of apertures of a lens is NA, the layout information is acquired from another said first design pattern provided at a region which is 1.3×(λ/NA) or more distant away from predetermined said first design pattern.

13. A method of manufacturing a semiconductor device, comprising:
forming a plurality of mask patterns formed by a mask making method, on a semiconductor substrate, the mask making method comprising forming each of the mask patterns by using a first design pattern, to be formed on the semiconductor substrate and including at least one correction pattern onto which correction has been applied by a pattern correcting method, the pattern correcting method comprising:
extracting at least the one correction pattern;
acquiring layout information from the first design pattern, the layout information affecting a finished plane shape of the correction pattern on the semiconductor substrate;
generating a design pattern-2 corresponding to the layout information so as to be associated with the correction pattern, the design pattern-2 including contents of correction on the basis of the layout information; and
correcting the correction pattern in accordance with the contents of correction.

14. The method according to claim 13, wherein
the layout information includes at least one of a size of the first design pattern, a shape of the first design pattern, an interval between predetermined said first design pattern and another said first design pattern adjacent to the predetermined said first design pattern, and a pattern covering rate by the first design pattern within a predetermined range from the predetermined said first design pattern.

15. The method according to claim 13, wherein
the extraction of the correction pattern, the acquisition of the layout information, the determination of the contents of correction, and the generation of the design pattern-2 are carried out at a time of making the first design pattern, and
the correction onto the correction pattern is carried out at a time of making design data of the mask pattern to form the first design pattern as a mask pattern on a mask.

16. The method according to claim 13, wherein
at least one of data related to a size of the design pattern-2 and data related to a placement of a layer of the design pattern-2 is set depending on the layout information, and
data of the design pattern-2 is classified depending on the layout information.

17. The method according to claim 13, wherein
the correction onto the correction pattern is carried out successively two times or more.

18. The method according to claim 13, wherein
given that a wavelength of an exposure light for use in exposing the first design pattern is λ, and a number of apertures of a lens is NA, the layout information is acquired from another said first design pattern provided at a region which is 1.3×(λ/NA) or more distant away from predetermined said first design pattern.

19. A pattern correction system comprising:
a pattern generating apparatus; and
a data processing apparatus, wherein
generation rules of a design pattern-2 are inputted to the pattern generating apparatus,
the design pattern-2 executes contents of correction included in the design pattern-2 onto at least one correction pattern included in a first design pattern to be formed on a substrate with respect to the correction pattern, and the contents of correction are based on the layout information which affects a finished plane shape of the correction pattern on the substrate,
the pattern generating apparatus generates the design pattern-2 on the basis of the generation rules, and so as to be associated with the correction pattern extracted from the first design pattern,
the first design pattern including the correction pattern and the design pattern-2 are inputted to the data processing apparatus from the pattern generating apparatus, and
the data processing apparatus corrects the correction pattern in accordance with the contents of correction.

20. A computer-readable recording medium having a pattern correction program recorded therein, the pattern correction program causing a computer to execute:
a correction pattern extraction process of extracting at least one or more correction patterns included in a first design pattern to be formed on a substrate;
a layout information acquisition process of acquiring layout information which affects a finished plane shape of the correction pattern on a semiconductor substrate from the first design pattern;
a design pattern-2 generation process of generating the design pattern-2 corresponding to the layout information so as to be associated with the correction pattern, the design pattern-2 including contents of correction on the basis of the layout information; and
a correction process of correcting the correction pattern in accordance with the contents of correction.

* * * * *